(12) United States Patent
Mizuki et al.

(10) Patent No.: US 8,717,340 B2
(45) Date of Patent: May 6, 2014

(54) THIN FILM TRANSISTOR, METHOD FOR MANUFACTURING SAME, AND DISPLAY APPARATUS

(75) Inventors: Toshio Mizuki, Osaka (JP); Akihiko Kohno, Osaka (JP); Kohichi Tanaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 194 days.

(21) Appl. No.: 13/519,562

(22) PCT Filed: Oct. 20, 2010

(86) PCT No.: PCT/JP2010/068501
§ 371 (c)(1),
(2), (4) Date: Jun. 27, 2012

(87) PCT Pub. No.: WO2011/080957
PCT Pub. Date: Jul. 7, 2011

(65) Prior Publication Data
US 2012/0287094 A1   Nov. 15, 2012

(30) Foreign Application Priority Data

Dec. 29, 2009   (JP) .................................. 2009-299222

(51) Int. Cl.
*G09G 5/00*   (2006.01)
(52) U.S. Cl.
USPC ................ 345/204; 345/92; 345/93; 345/210
(58) Field of Classification Search
USPC ................ 345/87–100, 204–215; 257/59–72; 438/486–488
See application file for complete search history.

(56) References Cited

U.S. PATENT DOCUMENTS

| 7,791,075 B2 * | 9/2010 | Kobayashi et al. ............. 257/59 |
| 8,187,956 B2 * | 5/2012 | Jinbo et al. ..................... 438/486 |
| 2006/0124934 A1 | 6/2006 | Fukumiya et al. |
| 2010/0062585 A1 | 3/2010 | Takahashi |

FOREIGN PATENT DOCUMENTS

| JP | 64-4070 A | 1/1989 |
| JP | H8-97432 A | 4/1996 |

(Continued)

OTHER PUBLICATIONS

International Search Report (ISR) issued in PCT/JP2010/068501 mailed in Jan. 2011.

*Primary Examiner* — Vijay Shankar
(74) *Attorney, Agent, or Firm* — Chen Yoshimura LLP

(57) ABSTRACT

Disclosed is a thin film transistor that is provided with a gate insulating film that is inexpensive, and that is less likely to have a low-density microcrystalline silicon layer formed thereon due to plasma induced damage, while suppressing fluctuation of a threshold voltage. In a TFT (100) having the bottom gate structure, since a silicon nitride film (31) having a natural oxide film (32) formed on the surface thereof is used as the gate insulating film (30), the gate insulating film (30) is not only capable of preventing the alkali metal ions contained in a glass substrate (10) from entering the gate insulating film (30), but also capable of suppressing a formation of the low-density microcrystalline silicon layer on the surface of a microcrystalline silicon film (41) on the side in contact with the gate insulating film (30). Since the mobility of the microcrystalline silicon film (41) is increased, the operation speed of the TFT (100) can be improved. Thus, with the simpler configuration, the TFT (100) having the same electrical characteristics as those of the conventional TFTs can be provided.

6 Claims, 10 Drawing Sheets

(56) References Cited

FOREIGN PATENT DOCUMENTS

| JP | 2001-13525 A | 1/2001 |
| JP | 2006-173327 A | 6/2006 |
| JP | 2008-177419 A | 7/2008 |
| JP | 2010-245438 A | 10/2010 |

* cited by examiner (a)

| Air Exposure Time | Natural Oxide Film | | Film Thickness of Low-density Microcrystalline Silicon Layer | Mobility of TFT |
|---|---|---|---|---|
| | Film Thickness | Oxygen Concentration | | |
| 1 hour | 4~6 nm | 7% | 5~7 nm | 0.5cm$^2$/V·sec |
| 12 hours | 4~6 nm | 12% | 3~5 nm | 1.0cm$^2$/V·sec |
| 24 hours | 4~6 nm | 16% | 2~3 nm | 1.2cm$^2$/V·sec |
| 48 hours | 4~6 nm | 20% | 2~3 nm | 1.3cm$^2$/V·sec |
| 96 hours | 4~6 nm | 24% | 2~3 nm | 1.3cm$^2$/V·sec |

(a)

(b)

(c)

(d)

(h)

(i)

(j)

THIN FILM TRANSISTOR, METHOD FOR MANUFACTURING SAME, AND DISPLAY APPARATUS

TECHNICAL FIELD

The present invention relates to a thin film transistor, a method for manufacturing the same, and a display device. More particularly, the present invention relates to a thin film transistor having a bottom-gate structure, a method for manufacturing the same, and a display device.

BACKGROUND ART

Conventionally, various insulating films, such as a silicon oxide ($SiO_2$) film, a silicon nitride (SiNx) film, and a silicon oxynitride (SiON) film, which are formed by a Plasma Enhanced Chemical Vapor Deposition Method (hereinafter referred to as a "plasma CVD method"), and a multilayer insulating film in which the above-mentioned films are appropriately combined and laminated, have been used as a gate insulating film of a thin film transistor (hereinafter referred to as a "TFT") having a bottom-gate structure.

Japanese Patent Application Laid-Open Publication 2008-177419 describes configurations of a TFT having the bottom-gate structure in which the gate insulating film is made of a silicon oxide film alone and in which the gate insulating film is made of a silicon nitride film alone, for example. Japanese Patent Application Laid-Open Publication H8-97432 describes a TFT having the bottom-gate structure in which the gate insulating film is made of a multilayer insulating film that is formed by laminating a silicon oxide film on a silicon nitride film by the plasma CVD method.

RELATED ART DOCUMENTS

Patent Documents

Patent Document 1: Japanese Patent Application Laid-Open Publication 2008-177419
Patent Document 2: Japanese Patent Application Laid-Open Publication H8-97432

SUMMARY OF THE INVENTION

Problems to be Solved by the Invention

However, in the TFT having the gate insulating film made of a silicon oxide film alone, alkali metal ions such as sodium ions contained in a glass substrate enter the silicon oxide film, and move inside the silicon oxide film, which results in a problem of fluctuation of the TFT threshold voltage.

When the gate insulating film of a TFT is made of a silicon nitride film alone, alkali metal ions in the glass substrate are not allowed to enter the silicon nitride film, and therefore, the fluctuation of the threshold voltage of the TFT can be prevented. However, because a surface of the silicon nitride film is damaged by plasma generated in forming a microcrystalline silicon film that forms a channel layer on the silicon nitride film, a low-density microcrystalline silicon layer having a film thickness of 5 to 7 nm is formed on a surface of the microcrystalline silicon film on the side in contact with the silicon nitride film. As a result, in the TFT having the bottom-gate structure, the resistivity near a surface of the channel layer in which ON current flows is increased, and therefore, a problem of the smaller mobility of the channel layer is caused.

When the gate insulating film is made of a multilayer insulating film that is formed by laminating a silicon oxide film on a silicon nitride film by the plasma CVD method, the number of the manufacturing steps of the gate insulating film is increased, which causes a problem of a higher manufacturing cost.

To solve these problems, an object of the present invention is to provide a TFT including a gate insulating film that is inexpensive and that is less likely to have a low-density crystalline semiconductor layer formed by plasma induced damage while suppressing the fluctuation of the threshold voltage. Another object of the present invention is to provide a method for manufacturing such a TFT.

Means for Solving the Problems

A first aspect of the present invention is a thin film transistor of a bottom-gate structure that is formed on an insulating substrate, including: a gate electrode formed on the insulating substrate; a gate insulating film formed so as to cover the insulating substrate including the gate electrode; and a channel layer that is made of a crystalline semiconductor film and that is formed on a surface of the gate insulating film, wherein the gate insulating film includes a nitride semiconductor film and an oxide semiconductor film with a film thickness of 4 to 6 nm that is formed on a surface of the nitride semiconductor film.

A second aspect of the present invention is the first aspect of the present invention, wherein the oxide semiconductor film is a natural oxide semiconductor film.

A third aspect of the present invention is the first aspect of the present invention, wherein the crystalline semiconductor film is a microcrystalline semiconductor film, and wherein an oxygen concentration of the oxide semiconductor film is 12% or more and 24% or less.

A fourth aspect of the present invention is a method for manufacturing a thin film transistor having a bottom-gate structure that is formed on an insulating substrate, including: forming a gate electrode on the insulating substrate; forming a gate insulating film so as to cover the insulating substrate including the gate electrode; and forming a crystalline semiconductor film that becomes a channel layer on the gate insulating film by a plasma CVD method, wherein forming the gate insulating film includes: forming a first nitride semiconductor film so as to cover the insulating substrate including the gate electrode; and forming a natural oxide semiconductor film on a surface of the first nitride semiconductor film by exposing a surface of the first nitride semiconductor film to a gas containing oxygen of a prescribed concentration for a prescribed period of time.

A fifth aspect of the present invention is the fourth aspect of the present invention, further including, after forming the crystalline semiconductor film, forming a second nitride semiconductor film on a surface of the crystalline semiconductor film so as not to expose a surface of the crystalline semiconductor film to a gas containing oxygen.

A sixth aspect of the present invention is the fifth aspect of the present invention, further including forming an etching stopper layer on the crystalline semiconductor film in a position facing the gate electrode by etching the second nitride semiconductor film.

A seventh aspect of the present invention is an active matrix display device that displays an image, including: a display unit that includes a plurality of gate wiring lines, a plurality of source wiring lines that intersect with the plurality of gate wiring lines, and pixel formation units arranged in a matrix corresponding to respective intersections of the plurality of gate wiring lines and the plurality of source wiring lines; a gate driver that selectively activates the plurality of gate wiring lines; and a source driver that applies an image signal representing an image that is to be displayed to the source wiring lines, wherein each of the pixel formation units includes a switching element that is turned on and off based on a signal applied to a corresponding gate wiring line, and wherein the switching element includes the thin film transistor according to the first aspect.

An eighth aspect of the present invention is an active matrix display device that displays an image, including: a display unit that includes a plurality of gate wiring lines, a plurality of source wiring lines that intersect with the plurality of gate wiring lines, and pixel formation units arranged in a matrix corresponding to respective intersections of the plurality of gate wiring lines and the plurality of source wiring lines; a gate driver that selectively activates the plurality of gate wiring lines; and a source driver that applies an image signal representing an image that is to be displayed to the source wiring lines, wherein the gate driver and the source driver include the thin film transistor according to the first aspect.

Effects of the Invention

According to the first aspect of the present invention, in a thin film transistor having a bottom-gate structure, a gate insulating film is constituted of a nitride semiconductor film and a thin oxide semiconductor film with a film thickness of 4 to 6 nm formed on a surface of the nitride semiconductor film. Because this nitride semiconductor film prevents impurity ions contained in the insulating substrate from entering the gate insulting film, it is possible to suppress the fluctuation of a threshold voltage of the TFT. Also, damage on a surface of the nitride semiconductor film that is caused by plasma generated in forming a crystalline semiconductor film on a surface of the gate insulating film is suppressed by the oxide semiconductor film. This makes it difficult for a low-density crystalline semiconductor layer to be formed on a surface of the crystalline semiconductor film on the side in contact with the gate insulating film, and the resistivity near the surface of the crystalline semiconductor film on the side in contact with the gate insulating film is lowered. Thus, the mobility of the crystalline semiconductor film is increased, and an ON current of the TFT can be thereby increased. As described above, a TFT that has the same electrical characteristics as those of a conventional TFT in which a gate insulating film is formed by laminating an oxide semiconductor film on a nitride semiconductor film by the plasma CVD method can be achieved with a simpler configuration.

According to the second aspect of the present invention, because the oxide semiconductor film formed on a surface of the nitride semiconductor film is a natural oxide semiconductor film, a gate insulating film that is capable of suppressing plasma induced damage on a surface of the nitride semiconductor film can be formed with ease at a low cost.

According to the third aspect of the present invention, when a microcrystalline semiconductor film is formed by the plasma CVD method on a surface of a gate insulating film that has an oxide semiconductor film with an oxygen concentration of 12% or higher and 24% or lower on a surface of a nitride semiconductor film, plasma induced damage on the surface of the nitride semiconductor film can be suppressed by the oxide semiconductor film. Accordingly, a low-density microcrystalline semiconductor layer is not formed almost at all on a surface of the microcrystalline semiconductor film on the side in contact with the gate insulating film, and therefore, an ON current of the thin film transistor can be increased.

According to the fourth aspect of the present invention, as a gate insulating film of a thin film transistor having a bottom gate structure, after a first nitride semiconductor film is formed, a surface of the first nitride semiconductor film is exposed to a gas containing oxygen of a prescribed concentration for a prescribed period of time so as to form a natural oxide semiconductor film. This makes it possible to suppress damage on a surface of the nitride semiconductor film caused by plasma generated in forming a crystalline semiconductor film on a surface of the gate insulating film, and therefore, a low-density crystalline semiconductor layer is less likely to be formed on a surface of the crystalline semiconductor film on the side in contact with the gate insulating film. As a result, the resistivity near the surface of the crystalline semiconductor film on the side in contact with the gate insulating film is lowered, which allows for an increase in the mobility and an increase in the ON current of the thin film transistor. In this way, a gate insulating film of a thin film transistor having the same electrical characteristics as those of a conventional thin film transistor can be formed at a lower manufacturing cost.

According to the fifth aspect of the present invention, a second nitride semiconductor film is formed on a surface of the crystalline semiconductor film so as not to expose the surface of the formed crystalline semiconductor film to a gas containing oxygen, and therefore, it is possible to prevent oxygen molecules from entering grain boundaries of the crystalline semiconductor film. This makes it possible to suppress a decrease in the conductivity of a channel layer in the thin film transistor.

According to the sixth aspect of the present invention, the second nitride semiconductor film is used as an etching stopper layer that protects a surface of the channel layer from being etched in forming a source region and a drain region by etching, and therefore, the manufacturing process of the thin film transistor can be simplified.

According to the seventh aspect of the present invention, by using the thin film transistor according to the first aspect as a switching element of a pixel formation unit, an ON current that flows in the thin film transistor is increased. In this case, because the thin film transistor can charge a signal voltage corresponding to an image signal provided by a source wiring line in a pixel capacitance in a short period of time, it is possible to increase the number of the pixel formation unit, thereby achieving the high resolution.

According to the eighth aspect of the present invention, the ON current that flows in the thin film transistor according to the first aspect is large. In this case, by using the thin film transistor according to the first aspect for a gate driver and a source driver, the operation speed of the gate driver and the source driver can be improved. As a result, the circuit size of the gate driver and the source driver can be reduced, which allows for a reduction in the frame size of the display unit and a reduction in the power consumption of the display device.

BRIEF DESCRIPTION OF THE DRAWINGS

FIG. 3 is a view showing a relationship among the air exposure time of a silicon nitride film, the oxygen concentration in a natural oxide film, and the mobility of a TFT.

DETAILED DESCRIPTION OF EMBODIMENTS

1. Basic Study

When a multilayer insulating film in which a silicon nitride film and a silicon oxide film are laminated in this order by the plasma CVD method is used as a gate insulating film of a TFT having the bottom-gate structure, it is possible not only to suppress the fluctuation of a threshold voltage of the TFT, but also to prevent the electron mobility (hereinafter abbreviated as "mobility") from lowering due to a low-density microcrystalline silicon layer. However, when such a multilayer insulating film formed by the plasma CVD method is used as the gate insulating film, the number of the manufacturing steps for the gate insulating film is increased, which creates a problem of a higher manufacturing cost. In view of this, discussed here is a method of forming, at a lower manufacturing cost, a gate insulating film of a TFT having the same electrical characteristics as those of a TFT in which a gate insulating film is made of a multilayer insulating film that is formed by laminating a silicon nitride film and a silicon oxide film in this order on a glass substrate by the plasma CVD method.

Figure 1:
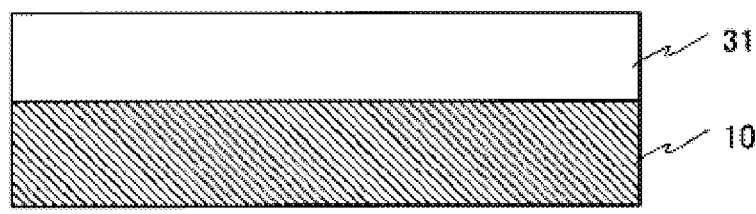
FIGS. 1($a$) to 1($c$) are process cross-sectional views showing a method of forming a silicon oxide film with a small film thickness on a surface of a silicon nitride film.
Figure 1:
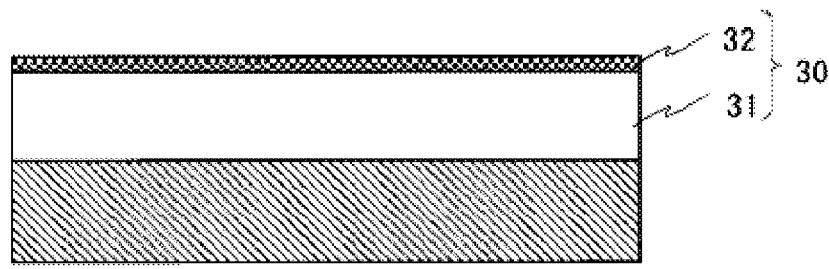
Figure 1:
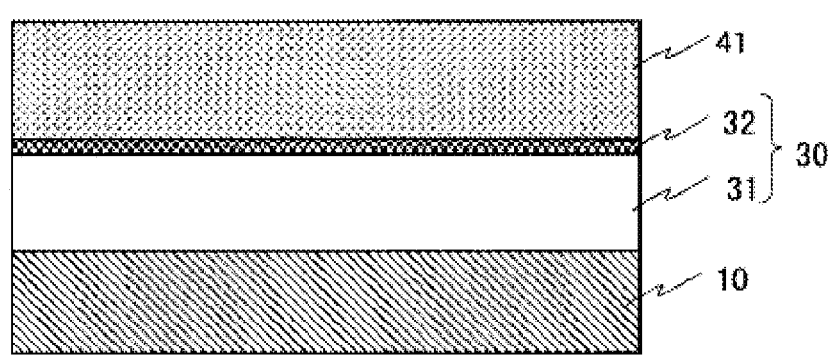

FIGS. 1(a) to 1(c) are process cross-sectional views showing a method of forming a silicon oxide film with a small film thickness on a surface of a silicon nitride film. As shown in FIG. 1(a), a silicon nitride film 31 is formed on a glass substrate 10 by the plasma CVD method. Next, as shown in FIG. 1(b), the silicon nitride film 31 is exposed to air in a clean room to form a natural oxide film (silicon oxide film) 32 on a surface of the silicon nitride film 31. The natural oxide film 32 formed on the silicon nitride film 31 is an ultrathin silicon oxide film with a film thickness of 4 to 6 nm. The silicon nitride film 31 having such a natural oxide film 32 thereon is used as a gate insulating film 30. Next, as shown in FIG. 1(c), a microcrystalline silicon film 41 that becomes a channel layer is formed on the surface of the silicon nitride film 31 having the natural oxide film 32 thereon. In this case, damage caused by plasma that is generated in forming the microcrystalline silicon film 41 is suppressed by the natural oxide film 32, that is, the surface of the silicon nitride film 31 becomes less likely to be damaged by the plasma. This prevents a low-density microcrystalline silicon layer from being formed on a surface of the microcrystalline silicon film 41 on the side in contact with the gate insulating film 30. The natural oxide film 32 is formed simply by exposing the glass substrate 10 having the silicon nitride film 31 thereon to air for a prescribed period of time, and therefore, it is possible to reduce the manufacturing cost of the gate insulating film 30.

Figure 2:
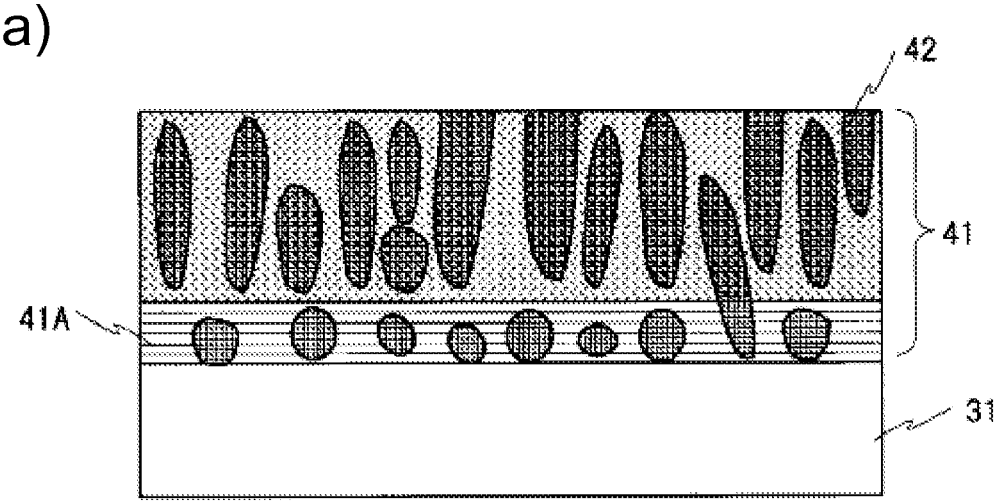
FIG. 2($a$) is a schematic view of a cross-section of a sample formed by laminating a silicon film by the plasma CVD method on a silicon nitride film that has been exposed to air for a prescribed period of time, which is observed in a bright-field image by a TEM, and FIG. 2($b$) is a schematic view showing an oxygen mapping image of the cross-section shown in FIG. 2($a$).
Figure 2:
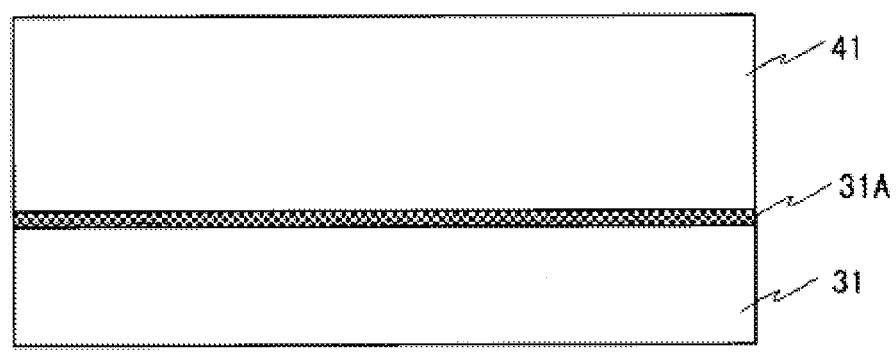

FIG. 2(a) is a schematic view of a cross-section of a sample formed by laminating the microcrystalline silicon film 41 by the plasma CVD method on the silicon nitride film 31 that has been exposed to air for a prescribed period of time, which is observed in a bright-field image by a Transmission Electron Microscope (hereinafter referred to as a "TEM"). FIG. 2(b) is a schematic view showing an oxygen mapping image of the cross-section of the sample shown in FIG. 2(a). As shown in FIG. 2(a), in the TEM observation of a cross-section of the sample that is formed by laminating the microcrystalline silicon film 41 by the plasma CVD method on the surface of the silicon nitride film 31, which has been exposed to air for a prescribed period of time, crystal grains 42 with a lattice structure were observed in the microcrystalline silicon film 41. The grain size of the crystal grain 42 varied in a range of 3 to 14 nm, and an average grain size was 7 nm. A region 41A that is located directly above the silicon nitride film 31 and that has a thickness of approximately 6 nm appeared brighter. Next, an HAADF (High Angle Annular Dark Field) image of the microcrystalline silicon film 41 was observed so as to study the density distribution thereof. In an HAADF image, a high-density region appears brighter, and a low-density region appears darker. According to the HAADF image that has been obtained, in the microcrystalline silicon film 41, the region 41A that is located directly above the silicon nitride film 31 and that has the thickness of approximately 6 nm appeared darker than a region thereabove. From this result, it became apparent that the region 41A is made of a low-density microcrystalline silicon layer. When the oxygen ($O_2$) concentration of the cross-section of the sample observed by the TEM was measured using an Electron Energy Loss Spectroscopy (EELS) method, as shown in FIG. 2(b), it became apparent that a region 31A having a high oxygen concentration was formed in an approximate thickness of 4 to 6 nm at the interface between the silicon nitride film 31 and the microcrystalline silicon film 41. From this result, it was verified that a thin oxide film, i.e., a natural oxide film, was formed on the surface of the silicon nitride film 31.

Below, a relationship among the air exposure time of a silicon nitride film, the film thickness of a natural oxide film formed on the surface of the silicon nitride film, and the oxygen concentration in the natural oxide film, and a relationship between the air exposure time of the silicon nitride film and the film thickness of the low-density microcrystalline silicon layer are discussed. After the silicon nitride film was exposed to air for a prescribed period of time so as to form a natural oxide film, the oxygen concentration in the natural oxide film was measured by an Auger Electron Spectroscopy (AES) method, and the thickness of the natural oxide film and the thickness of a low-density microcrystalline silicon layer were measured by the TEM. Further, a TFT having a channel layer made of a microcrystalline silicon film was formed on the surface of the silicon nitride film having the natural oxide film thereon, and the mobility thereof was measured.

FIG. 3 is a table showing the relationship among the air exposure time of the silicon nitride film, the oxygen concentration in the natural oxide film, and the mobility of the TFT. As shown in FIG. 3, as the air exposure time of the silicon nitride film becomes longer, the oxygen concentration in the natural oxide film formed on the surface of the silicon nitride film becomes higher, the film thickness of a low-density microcrystalline silicon layer becomes smaller, and the mobility of the TFT becomes higher. In the natural oxide film that was formed by exposing the silicon nitride film to air for 12 hours, the oxygen concentration was 12%, and the film thickness was approximately 4 nm. Also, the film thickness of the low-density microcrystalline silicon layer was approximately 4 nm. In this case, in a TFT that uses a silicon nitride film having a natural oxide film thereon as the gate insulating film thereof and that uses a microcrystalline silicon layer formed on a surface of the gate insulating film as the channel layer thereof, the mobility of the channel layer was 1.0 $cm^2$/V·cm. As the air exposure time of the silicon nitride film was prolonged over 12 hours, the oxygen concentration of the natural oxide film, the film thickness of the low-density microcrystalline silicon layer, and the mobility of the TFT tend to become saturated. Specifically, when the oxygen concentration of the natural oxide film is in a range of 12 to 24%, the mobility of the TFT was sufficiently large. The film thickness of the natural oxide film remained in the same range of 4 to 6 nm even when the air exposure time of the surface of the silicon nitride film was changed in a range of 1 hour to 96 hours.

In forming the natural oxide film on the surface of the silicon nitride film, the silicon nitride film may be exposed to a gas containing an oxygen gas, instead of exposing it to the air. In this case, in order to prevent the time required to form the natural oxide film from becoming longer than necessary, it is preferable that the concentration of an oxygen gas contained in the gas be approximately the same as the oxygen concentration in the air, which is 20%, or higher. By setting the concentration of the oxygen gas to be higher than 20%, the formation time of the natural oxide film can be shortened. The formation time of the natural oxide film can also be shortened by increasing the pressure of the gas containing the oxygen gas.

The present inventors think that the low-density microcrystalline silicon layer is formed on the surface of the silicon nitride film in forming the microcrystalline silicon film on the surface of the silicon nitride film for the following reason. When a microcrystalline silicon film is formed on a surface of a silicon nitride film, nitrogen atoms contained in the silicon nitride film and hydrogen atoms in a monosilane ($SiH_4$) gas or a hydrogen ($H_2$) gas used in forming the microcrystalline silicon film are bonded, thereby generating ammonia ($NH_3$). Because ammonia has a high vapor pressure of 200 Pa at −20° C., the resultant ammonia is readily gasified. As a result, on the surface of the silicon nitride film, the nitrogen atoms become ammonia, and are gasified one after another, and the remaining silicon atoms form a porous silicon layer on the surface of the silicon nitride film. When a microcrystalline silicon film is formed on such a porous silicon film having the disorderly crystallinity, a low-density microcrystalline silicon layer is formed on a surface of the microcrystalline silicon film on the side in contact with the silicon nitride film.

On the other hand, when a microcrystalline silicon film is formed on a surface of a silicon oxide film, oxygen atoms contained in the silicon oxide film and hydrogen atoms in a monosilane gas or a hydrogen gas are bonded, thereby generating water ($H_2O$). However, because water has a low vapor pressure of 100 Pa at −20° C., the resultant water is not readily gasified, and is likely to stay on the surface of the silicon oxide film. This prevents the silicon atoms from being left alone on the surface of the silicon oxide film, and therefore, a porous silicon layer is not formed on the surface of the silicon oxide film almost at all. Thus, in forming a microcrystalline silicon film on the surface of the silicon oxide film, it is highly unlikely that a low-density microcrystalline silicon layer is formed on a surface of the microcrystalline silicon film on the side in contact with the silicon oxide film.

In a manner similar to above, when forming the natural oxide film 32 that is a silicon oxide film with a small film thickness on a surface of the silicon nitride film 31, and forming the microcrystalline silicon film 41 on the natural oxide film 32 as shown in FIG. 1(c), oxygen atoms contained in the natural oxide film 32 and hydrogen atoms in a monosilane gas or a hydrogen gas are bonded, thereby generating water. Because the surface of the silicon nitride film 31 is covered by the natural oxide film and the resultant water, nitrogen atoms in the silicon nitride film 31 are less likely to bond with hydrogen atoms in a monosilane gas or a hydrogen gas, and to thereby form ammonia. As a result, the film thickness of a porous silicon film formed on the surface of the silicon nitride film 31 becomes small. Therefore, unlike the case in which the microcrystalline silicon film is directly formed on the surface of the silicon nitride film, when the microcrystalline silicon film 41 is formed on the surface of the gate insulating film 30 covered by the natural oxide film 32, it becomes possible to reduce the film thickness of the low-density microcrystalline silicon layer that is formed on a surface of the microcrystalline silicon film 41 on the side in contact with the gate insulating film 30.

2. Embodiment 2.1 Configuration of TFT

Figure 4:
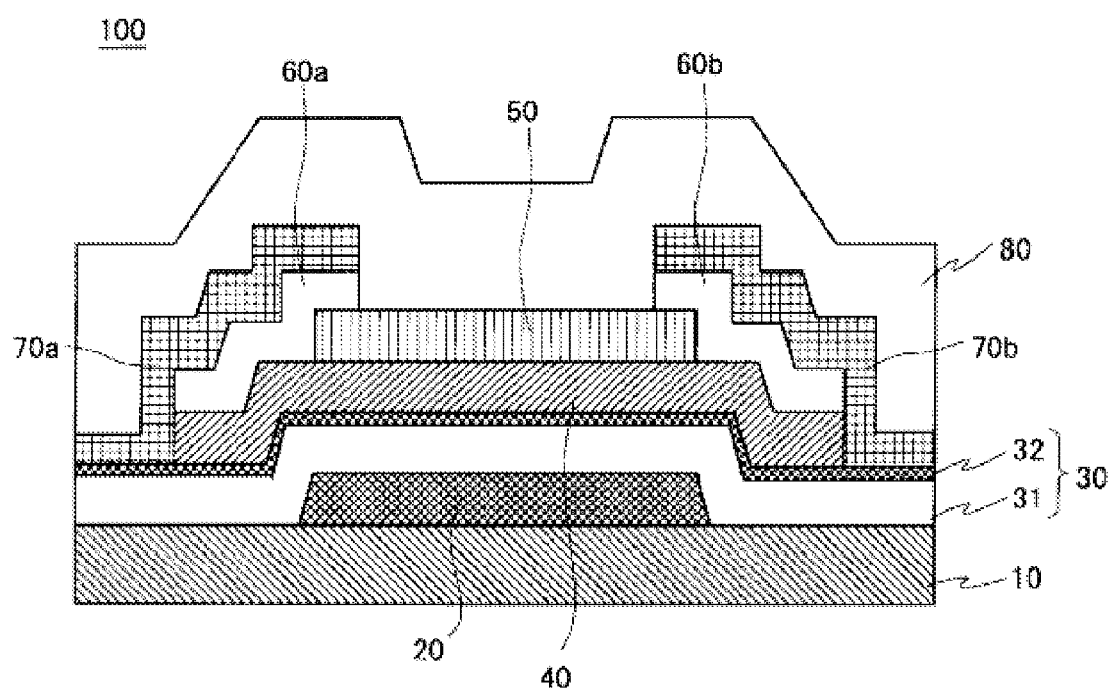
FIG. 4 is a cross-sectional view showing a configuration of a TFT according to an embodiment of the present invention.

FIG. 4 is a cross-sectional view showing a configuration of a TFT 100 according to an embodiment of the present invention. The configuration of the TFT 100 is described with reference to FIG. 4. As shown in FIG. 4, a gate electrode 20 made of a metal is formed on a glass substrate 10 that is an insulating substrate. A gate insulating film 30 is formed so as to cover the glass substrate 10 including the gate electrode 20. The gate insulating film 30 includes the silicon nitride film 31 and the natural oxide film (silicon oxide film) 32 with a film thickness of 4 to 6 nm formed on the silicon nitride film 31. The oxygen concentration of the natural oxide film 32 needs to be at least 12% or higher, and is preferably 24% or lower.

On a surface of the gate insulating film 30, an island-shaped channel layer 40 that extends horizontally over the gate electrode 20 in a plan view is formed. The channel layer 40 is made of microcrystalline silicon, which is intrinsic silicon that is not doped with an impurity.

On a surface of a channel region of the channel layer 40, an etching stopper layer 50 made of silicon nitride is formed. An $n^+$ silicon layer 60a (also referred to as a "source region") that extends so as to cover the upper surface of the left end of the etching stopper layer 50 to the left end of the channel layer 40, and an $n^+$ silicon layer 60b (also referred to as a "drain region") that extends so as to cover the upper surface of the right end of the etching stopper layer 50 to the right end of the channel layer 40 are formed. These $n^+$ silicon layers 60a and 60b are made of non-crystalline silicon doped with a highly concentrated n-type impurity, and are separated to the right and to the left over the etching stopper layer 50.

A source electrode 70a that extends from the right end of the $n^+$ silicon layer 60a to the gate insulating film 30 so as to cover the $n^+$ silicon layer 60a, and a drain electrode 70b that extends from the left end of the $n^+$ silicon layer 60b to the gate insulating film 30 so as to cover the $n^+$ silicon layer 60b are formed. The source electrode 70a and the drain electrode 70b are made of the same metal. The source electrode 70a is connected to the channel layer 40 through the $n^+$ silicon layer 60a so as to form an ohmic contact, and the drain electrode 70b is connected to the channel layer 40 through the $n^+$ silicon layer 60b so as to form an ohmic contact. Further, a protective film 80 made of a silicon nitride film is formed so as to cover the glass substrate 10 including the source electrode 70a and the drain electrode 70b.

2.2 Method for Manufacturing TFT

FIGS. 5(a) to 5(d), FIGS. 6(e) to 6(g), and FIGS. 7(h) to 7(j) are process cross-sectional views showing respective manufacturing steps of the TFT 100 shown in FIG. 4. The method for manufacturing the TFT 100 is described with reference to FIGS. 5(a) to 5(d), FIGS. 6(e) to 6(g), and FIGS. 7(h) to 7(j). First, on the glass substrate 10, a metal film (not shown) mainly made molybdenum (Mo) is formed in a film thickness of 100 to 500 nm by sputtering, for example. Instead of the metal film mainly made of molybdenum, a metal film mainly made of tungsten (W), tantalum (Ta), titanium (Ti), aluminum (Al), or the like, or a metal film made of an alloy thereof may be formed. The metal film may be a single-layered film made of one of the above-mentioned metal films, or a multilayer metal film formed by laminating metal films that are appropriately selected from those metal films.

Figure 5:
FIGS. 5(a) to 5(d) are process cross-sectional views showing respective manufacturing steps of the TFT shown in FIG. 4.
Figure 5:
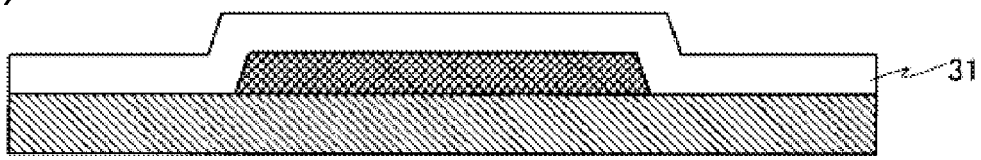
Figure 5:
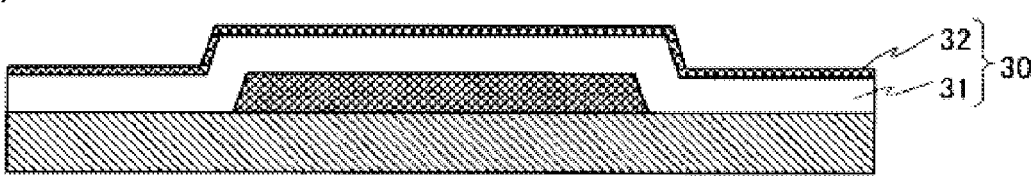
Figure 5:
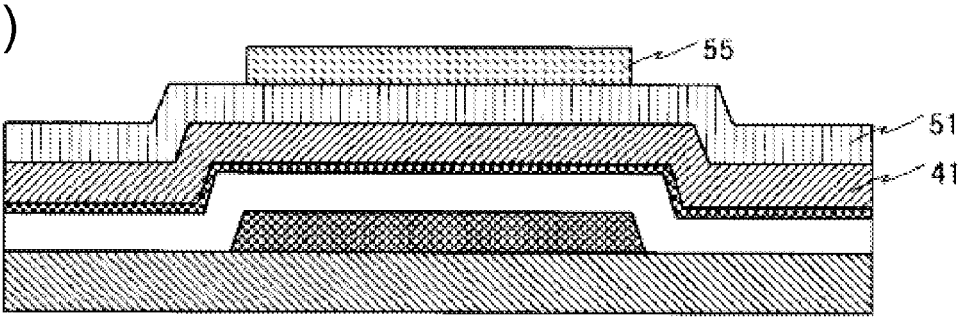

On a surface of the metal film, a resist pattern (not shown) is formed by photolithography. As shown in FIG. 5(a), the metal film is etched by a wet-etching method using the resist pattern as a mask, thereby forming the gate electrode 20. Thereafter, the resist pattern is stripped. Instead of the wet-etching method, a dry-etching method may be used to form the gate electrode 20.

As shown in FIG. 5(b), the silicon nitride film 31 with a film thickness of 100 to 400 nm, for example, is formed so as to cover the glass substrate 10 including the gate electrode 20 by the plasma CVD method. In forming the silicon nitride film 31, a source gas containing a monosilane gas and an ammonia gas is used.

As shown in FIG. 5(c), the glass substrate 10 having the silicon nitride film 31 formed thereon is stored for a long period of time in a room inside a clean room, in which the air cleanliness is higher, and a pressure is set to be the same or slightly higher than the atmospheric pressure. As described, by storing the glass substrate in the room with the higher air cleanliness, the thin natural oxide film 32 is formed on a surface of the silicon nitride film 31. The silicon nitride film 31 having the natural oxide film 32 on the surface thereof serves as the gate insulating film 30.

The film thickness and the oxygen concentration of the natural oxide film 32 are determined in accordance with the air exposure time of the silicon nitride film 31. From the result of the above basic research, the film thickness of the natural oxide film 32 needs to be approximately 4 to 6 nm, and the oxygen concentration of the natural oxide film needs to be 12% or higher in the TFT 100. Therefore, the glass substrate 10 having the silicon nitride film 31 formed thereon is stored in the air for 12 hours or longer. Even if it is stored over 24 hours, the film thickness and the oxygen concentration of the natural oxide film 32 do not increase almost at all, and because it lowers the throughput, it is preferable that the storing time be 24 hours or less.

It is preferable that the glass substrate 10 having the silicon nitride film 31 formed thereon be stored in a room that has a high cleanliness, i.e., Class 1 (one particle with a grain size of 0.5 μm or larger per one cubic feet of air) or higher, for example. In order to maintain the high cleanliness of the room, air that has been filtered through a HEPA filter to remove contamination and particles is fed to the room from the ceiling by down-flowing, and the air is exhausted from the floor having a grating structure. The pressure of the room is set to be higher than the pressure of the outside by approximately 5 to 10 Pa so that particles and contamination do not enter the room from the outside.

Alternatively, the natural oxide film 32A may be formed on the surface of the silicon nitride film 31 by thermally-oxidizing the surface of the silicon nitride film 31. Specifically, a thin silicon oxide film may be formed on the surface of the silicon nitride film 31 by supplying an oxygen gas or water vapor to the surface of the silicon nitride film 31 at a temperature of 400 to 450° C. In this case, it is possible to significantly reduce the time required to form the silicon oxide film on the surface of the silicon nitride film 31 as compared with the case of forming the natural oxide film 32.

Alternatively, a plasma oxidation method may be used to form a silicon oxide film on a surface of a silicon nitride film. In the plasma oxidation method, under a pressure of approximately 90 to 100 kPa, an inert gas such as an argon (Ar) gas and a nitrogen ($N_2$) gas, which becomes a discharge gas, is injected to a chamber together with an oxygen gas as a reactant gas, and thereafter, high frequency electric field is applied. As a result, the discharge gas is excited, thereby generating plasma, and by the plasma of the discharge gas coming in contact with the reactant gas, oxygen plasma is generated. By exposing the silicon nitride film formed on a glass substrate to the resultant oxygen plasma, a thin oxide film is formed on a surface of the silicon nitride film. It is preferable that the gas used for the plasma oxidation be a mixed gas of a discharge gas and a reactant gas, and the mixed gas contain approximately 0.01 to 10% of an oxygen gas as a reactant gas by volume. Also, it is preferable that the glass substrate 10 be heated to 150 to 300° C. According to the plasma oxidation method, because the growth speed of the silicon oxide film is slow, the film thickness of the silicon oxide film can be controlled with ease.

The gate insulating film 30 undergoes a hydrogenation treatment so as to terminate, by hydrogen atoms, dangling bonds of silicon atoms that exist on a surface thereof. As a plasma device for the hydrogenation treatment, a high-density plasma CVD device of the ICP (Inductively Coupled Plasma) type or the surface wave plasma type can be used. By using such a high-density plasma device, it is possible to perform a step of forming the microcrystalline silicon film 41 successively to the hydrogenation treatment by simply changing the condition settings. In the present embodiment, in order to minimize changes in the processing conditions, the hydrogenation treatment is performed under the same processing conditions as those for the formation of the microcrystalline silicon film 41, which will be later described, except that the flow volume ratio of the hydrogen gas to the monosilane gas is adjusted such that the ratio of the hydrogen gas becomes higher.

The specific processing conditions for the hydrogenation treatment are as follows: the temperature inside a chamber of the plasma CVD device is set to 250 to 300° C.; the pressure is set to 5 to 20 mTorr; the RF power is set to 5 to 50 mW/cm$^3$, and the flow volume ratio of the hydrogen gas to the monosilane gas is set to 100 to 500. It is more preferable that the temperature be set to 300° C., the pressure be set to 10 mTorr, the RF power be set to 20 mW/cm$^3$, and the flow volume ratio of the hydrogen gas to monosilane gas be set to 150 (hydrogen gas flow volume: 150 ccm, monosilane gas flow volume: 1 ccm). As described above, the flow volume of the hydrogen gas is considerably higher than the flow volume of the monosilane gas, and therefore, it is possible to perform the hydrogenation treatment efficiently.

As shown in FIG. 5(d), the microcrystalline silicon film 41 with a film thickness of 50 nm, for example, is formed on a surface of the gate insulating film 30. The microcrystalline silicon film 41 is formed by using the same device as the high-density plasma CVD device used for the hydrogenation treatment. The film-formation conditions are the same as the conditions of the hydrogenation treatment except for the flow volume ratio of the hydrogen gas to the monosilane gas. The flow volume ratio of the hydrogen gas to the monosilane gas in forming the microcrystalline silicon film 41 is set to a range of 1 to 50, and is preferably 20 (hydrogen gas flow volume: 400 ccm, monosilane gas flow volume: 20 ccm). As described above, the flow volume ratio of the hydrogen gas to the monosilane gas is lower than that of the hydrogenation treatment.

A silicon nitride film 51 is formed on a surface of the microcrystalline silicon film 41 by the plasma CVD method. The silicon nitride film 51 is formed in a thickness of 150 nm, for example, by using a source gas containing a monosilane gas and an ammonia gas. For the reason described below, it is preferable that the silicon nitride film 51 be formed successively to the formation of the microcrystalline silicon film 41 such that a region of the microcrystalline silicon film 41 where a channel region is to be formed is not exposed to the air. The reason for such a successive film-formation is that, when the microcrystalline silicon film 41 containing columnar crystals and granular crystals is exposed to the air, oxygen molecules in the air enter the grain boundaries of the microcrystalline silicon film 41, which causes a problem of reducing the conductivity of the channel region. Therefore, in order to prevent oxygen molecules from entering the grain boundaries of the region where the channel region is to be formed, a plasma CVD device equipped with a plurality of chambers is used, and the glass substrate 10 having the microcrystalline silicon film 41 thereon is transferred from the chamber where the microcrystalline silicon film 41 was formed to another chamber without breaking the vacuum. This way, the silicon nitride film 51 is preferably formed on a surface of the microcrystalline silicon film 41 without exposing the formed microcrystalline silicon film 41 to the air. Next, a resist pattern 55 is formed on a surface of the silicon nitride film 51 by photolithography.

Figure 6:
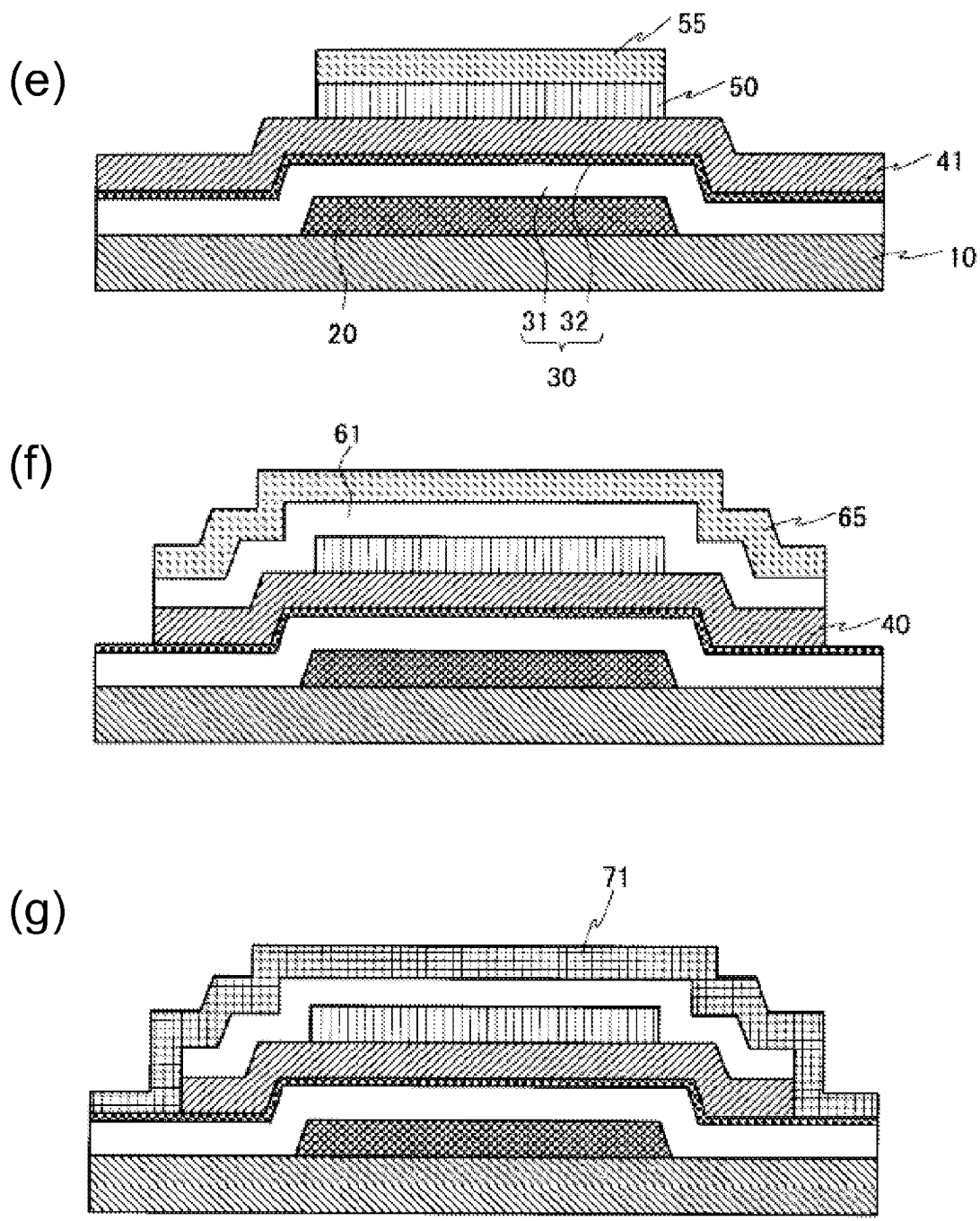
FIGS. 6(e) to 6(g) are process cross-sectional views showing respective manufacturing steps of the TFT shown in FIG. 4.

As shown in FIG. 6(e), the silicon nitride film 51 is etched by a plasma etching method using the resist pattern 55 as a mask, thereby forming the etching stopper layer 50, and thereafter, the resist pattern 55 is stripped. As a result, in the microcrystalline silicon film 41, a portion of the microcrystalline silicon film 41 that is located above the gate electrode 20 becomes a channel region.

The etching stopper layer 50 also serves as a protective film that protects the region to be a channel region of the channel layer 40 from being etched when etching is performed to separate the $n^+$ silicone layer 61 to the right and the left, which will be described later. As described above, the etching stopper layer 50 has a function of blocking oxygen molecules from entering the grain boundaries of the region that becomes the channel region, and also has a function of protecting the region that becomes the channel region from being etched. Thus, by forming the etching stopper layer 50, the manufacturing process of the TFT 100 can be simplified as compared with a case in which multiple films respectively having such functions need to be formed.

As shown in FIG. 6(f), an $n^+$ silicon film (not shown) containing a highly concentrated n-type impurity, for example, is formed by the plasma CVD method on a surface of the microcrystalline silicon film 41 including the etching stopper layer 50. The film thickness of the $n^+$ silicon film is 50 nm, for example, and the film is formed by using a source gas containing a monosilane gas and a phosphine ($PH_3$) gas.

Further, the resist pattern 65 is formed on a surface of the $n^+$ silicon film by photolithography, and the $n^+$ silicon film and the microcrystalline silicon film 41 are continuously etched by dry-etching using the resist pattern 65 as a mask. Thereafter, the resist pattern 65 is stripped. As a result, the island-shaped $n^+$ silicon layer 61 is formed of the $n^+$ silicon film, and the island-shaped channel layer 40 is formed of the microcrystalline silicon film 41.

As shown in FIG. 6(g), a source metal film 71 is formed on the $n^+$ silicon layer 61 by sputtering. The source metal film 71 is a metal film that is formed by laminating a titanium film with a film thickness of 50 to 200 nm, an aluminum film with a film thickness of 200 to 1000 nm, and a titanium film with a film thickness of 50 to 200 nm in this order from the side of the $n^+$ silicon layer 61, for example.

Figure 7:
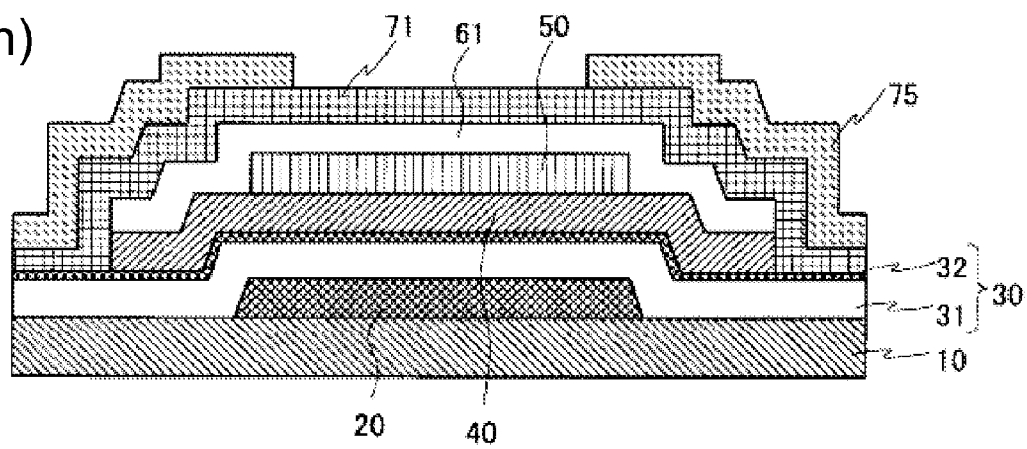
FIGS. 7(h) to 7(j) are process cross-sectional views showing respective manufacturing steps of the TFT shown in FIG. 4.
Figure 7:
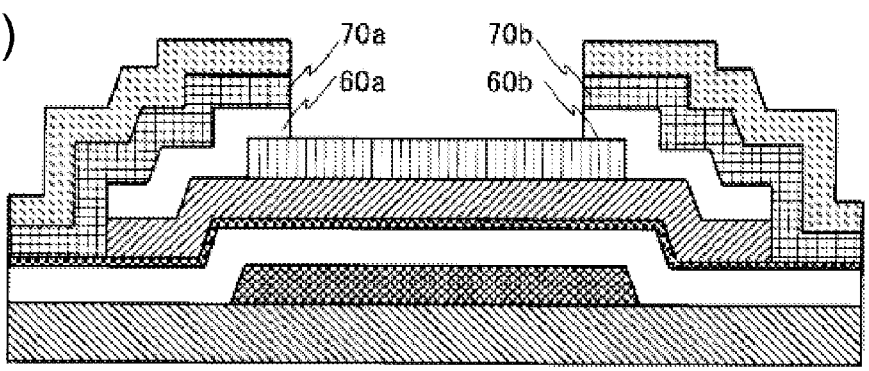
Figure 7:
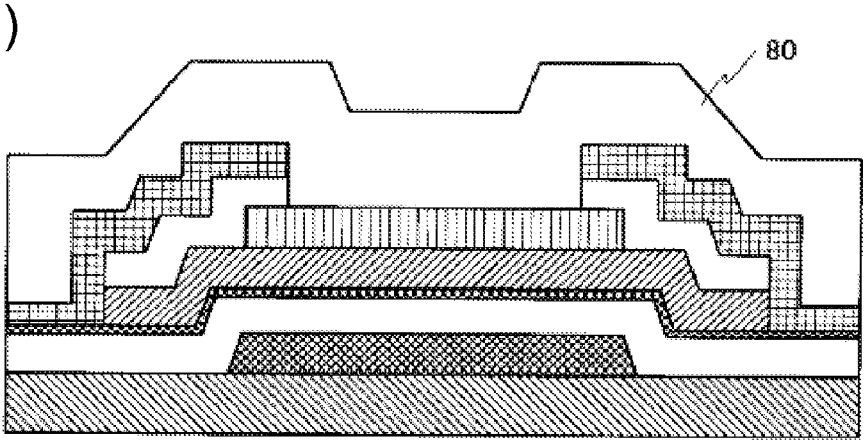

As shown in FIG. 7(h), a resist pattern 75 that has an opening above the etching stopper layer 50 is formed on a surface of the source metal film 71 by photolithography. Next, as shown in FIG. 7(i), the respective metal films that constitute the source metal film 71 are etched in order from the top by wet-etching using the resist pattern 75 as a mask, thereby forming the source electrode 70a and the drain electrode 70b. The etchant used for the wet-etching of the source metal film 71 is a water solution containing nitric acid ($HNO_3$), acetic acid ($CH_3COOH$), and phosphoric acid ($H_3PO_4$), for example. The source metal film 71 may be etched by a plasma etching method instead of the wet-etching method.

Further, the $n^+$ silicon layer 61 is etched by a plasma etching method using the resist pattern 75 as a mask, thereby forming the two $n^+$ silicon layers 60a and 60b that respectively are the right portion and the left portion separated above the etching stopper layer 50. Because the etching stopper layer 50 made of silicon nitride is formed on the top surface of the region that becomes the channel region of the microcrystalline silicon film 41, etching of the $n^+$ silicon layer 61 is stopped at the etching stopper layer 50, thereby preventing the region that becomes the channel region from being etched. The $n^+$ silicon layer 60a extends so as to cover the top left end of the etching stopper layer 50 to the left end of the channel layer 40, and the $n^+$ silicon layer 60b extends so as to cover the top right end of the etching stopper layer 50 to the right end of the channel layer 40. The source electrode 70a is connected to the channel layer 40 through the $n^+$ silicon layer 60a, thereby establishing an ohmic contact, and the drain electrode 70b is connected to the channel layer 40 through the $n^+$ silicon layer 60b, thereby establishing an ohmic contact.

As shown in FIG. 7(j), the protective film 80 made of silicon nitride is formed so as to cover the gate insulating film 30 including the source electrode 70a and the drain electrode 70b. The protective film 80 is formed in a film thickness of 200 nm, for example, by the plasma CVD method using a source gas containing a monosilane gas and an ammonia gas.

2.3 Effects

As apparent from the description above, in the TFT 100 having the bottom-gate structure, an insulating film having the natural oxide film 32 on the surface of the silicon nitride film 31 is used as the gate insulating film 30, and therefore, the silicon nitride film 31 prevents alkali metal ions contained in the glass substrate 10 from entering the gate insulating film 30. This makes it possible to prevent the fluctuation of the threshold voltage of the TFT 100. On the surface of the silicon nitride film 31, a natural oxide film with a film thickness of 4 to 6 nm having the oxygen concentration of 12% or higher is formed. This way, in forming the microcrystalline silicon film 41 on the gate insulating film 30, a low-density microcrystalline silicon layer is less likely to be formed on a surface of the microcrystalline silicon film 41 on the side in contact with the gate insulating film 30. As a result, the mobility of the microcrystalline silicon film 41 is increased, and therefore, the ON resistance of the TFT 100 is reduced and the operation speed is thereby improved. Moreover, by using the gate insulating film 30 having the natural oxide film 32 formed on the surface of the silicon nitride film 31, it is possible to achieve, with a simpler configuration, the TFT 100 having the same electric characteristics as those of a conventional TFT in which a gate insulating film is formed by laminating a silicon oxide film on the silicon nitride film 31 by the plasma CVD method.

The natural oxide film 32 on the surface of the silicon nitride film 31 is formed simply by exposing the silicon nitride film 31 to the air in a clean room for a prescribed period of time, and therefore, it is possible to form the gate insulating film 30 at a lower manufacturing cost than a conventional TFT.

3. Application to Liquid Crystal Display Device

Figure 8:
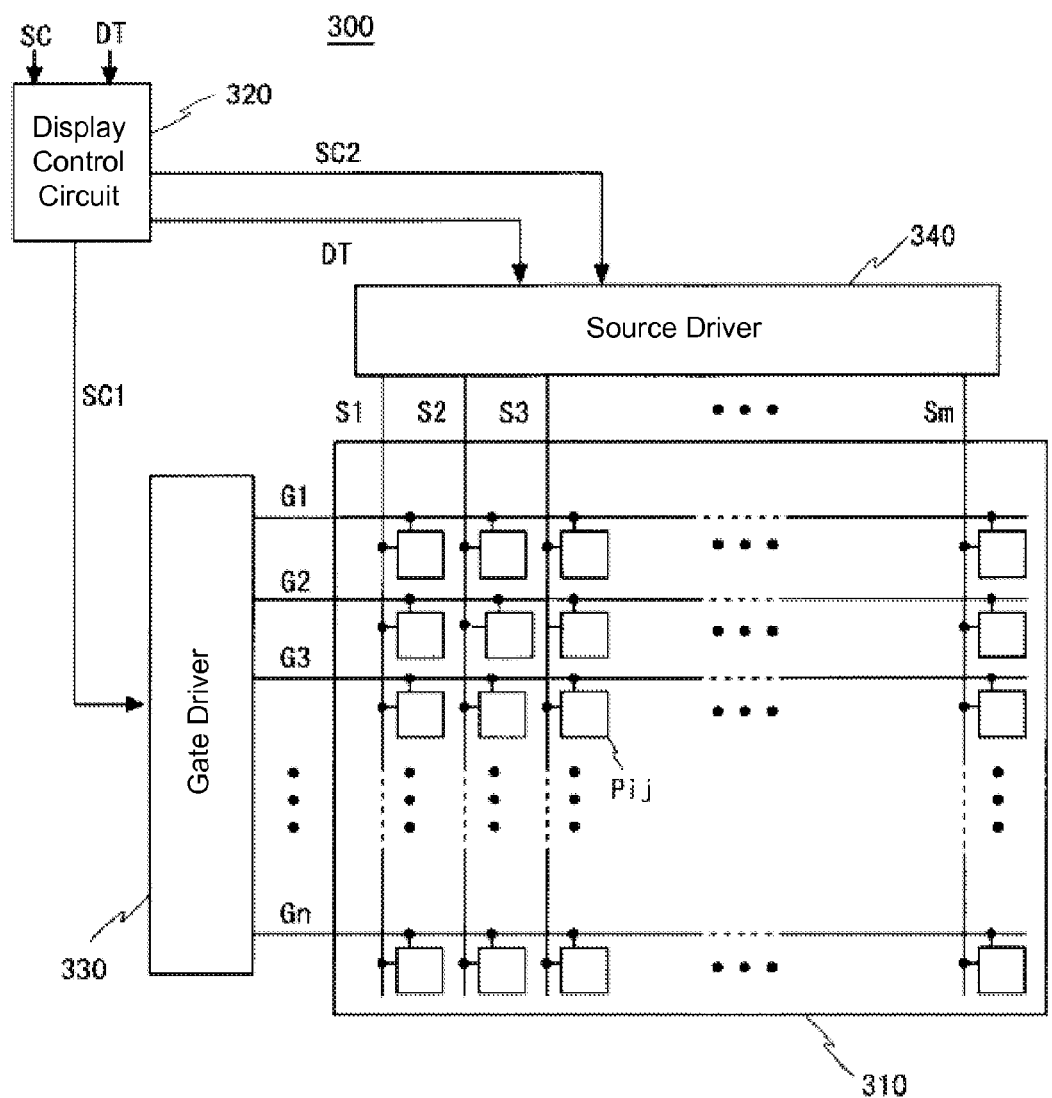
FIG. 8 is a block diagram showing a configuration of a liquid crystal display device using the TFT shown in FIG. 4.

FIG. 8 is a block diagram showing a configuration of a liquid crystal display device 300 using the TFT 100 shown in FIG. 4. The liquid crystal display device 300 shown in FIG. 8 includes a liquid crystal panel 310, a display control circuit 320, a gate driver 330, and a source driver 340. In the liquid crystal panel 310, n (n is an integer of 1 or greater) number of gate wiring lines G1 to Gn extending in the horizontal direction, and m (m is an integer of 1 or greater) number of source wiring lines S1 to Sm extending in a direction intersecting with the gate wiring lines G1 to Gn are formed. At each intersection of the i-th ("i" is an integer of 1 or greater and smaller than "n") gate wiring line G1 and the j-th ("j" is an integer of 1 or greater and smaller than "m") source wiring line Sj, a pixel formation unit Pij is formed.

The display control circuit 320 is supplied with a control signal SC and an image signal DT such as a horizontal synchronization signal and a vertical synchronization signal from the outside of the liquid crystal display device 300. In accordance with these signals, the display control circuit 320 outputs a control signal SC1 to the gate driver 330, and outputs a control signal SC2 and the image signal DT to the source driver 340.

The gate driver 330 is connected to the gate wiring lines G1 to Gn, and the source driver 340 is connected to the source wiring lines S1 to Sm. The gate driver 330 sequentially sends a high-level signal representing a selected state to the gate wiring lines G1 to Gn, thereby sequentially selects the gate wiring lines G1 to Gn one by one. When the i-th gate wiring line Gi is selected, for example, pixel formation units Pi1 to Pim in that single row are selected at once. The source driver 340 applies voltages that correspond to the image signal DT to the respective source wiring lines S1 to Sm, and therefore, voltages that correspond to the image signal DT are written in the pixel formation units Pi1 to Pim in the single row that has been selected. In this way, the liquid crystal display device 300 displays an image on the liquid crystal panel 310. The liquid crystal panel 310 may also be referred to as a display unit.

Figure 9:
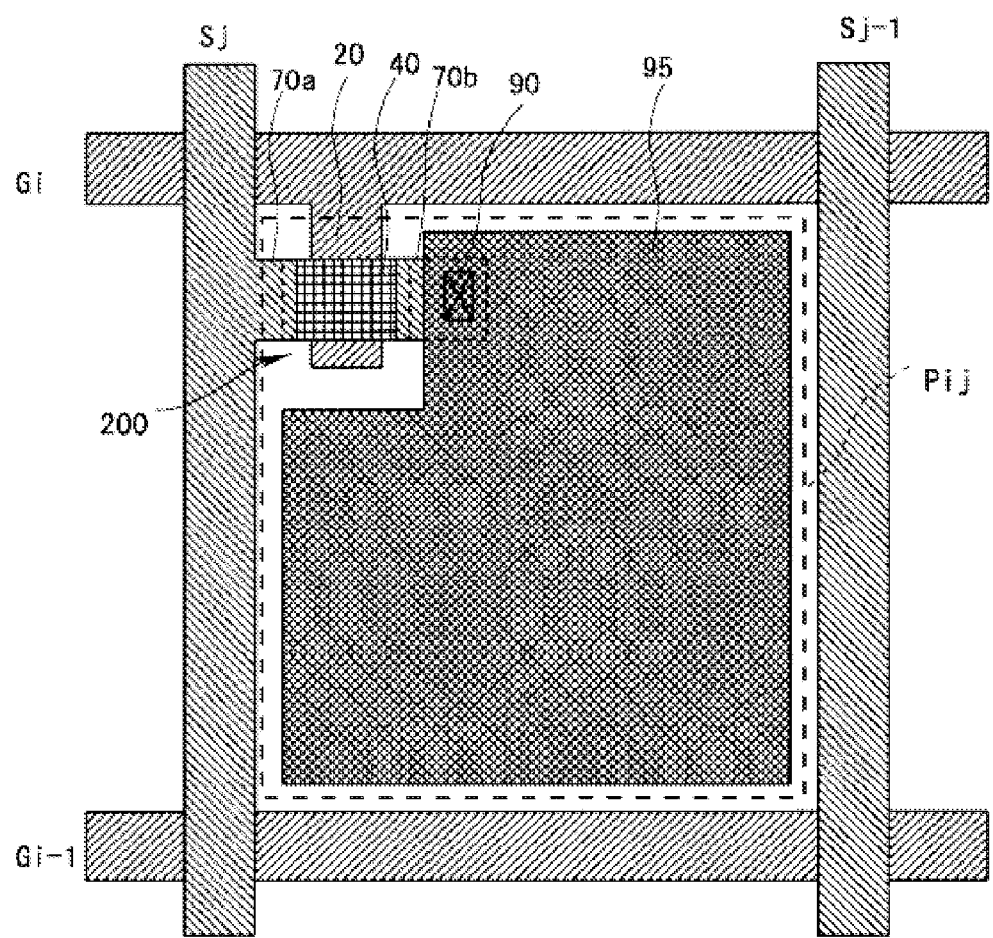
FIG. 9 is a plan view showing a pattern arrangement of a pixel formation unit formed in a liquid crystal panel.

FIG. 9 is a plan view showing a pattern arrangement of the pixel formation unit Pij formed in the liquid crystal panel 310. As shown in FIG. 9, the liquid crystal panel 310 includes the i-th gate wiring line Gi extending in the horizontal direction, the j-th source wiring line Sj extending in a direction intersecting with the gate wiring line Gi, and the pixel formation unit Pij disposed in an area enclosed by the gate wiring lines Gi and Gi−1 and the source wiring line Sj and Sj−1. The pixel formation unit Pij includes a TFT 200 that serves as a switching element, and a gate electrode 20 of the TFT 200 is electrically connected to the gate wiring line Gi. Above the gate electrode 20, an island-shaped channel layer 40 that extends horizontally over the gate electrode 20 is formed. The left end of the channel layer 40 is electrically connected to the source electrode 70a that extends from the source wiring line Sj, and the right end of the channel layer 40 is electrically connected to the drain electrode 70b. The drain electrode 70b is connected to the pixel electrode 95 through a contact hole 90. The pixel electrode 95 and an opposite electrode (not shown) constitute a pixel capacitance that stores a voltage that corresponds to the image signal DT for a prescribed period of time.

Figure 10:
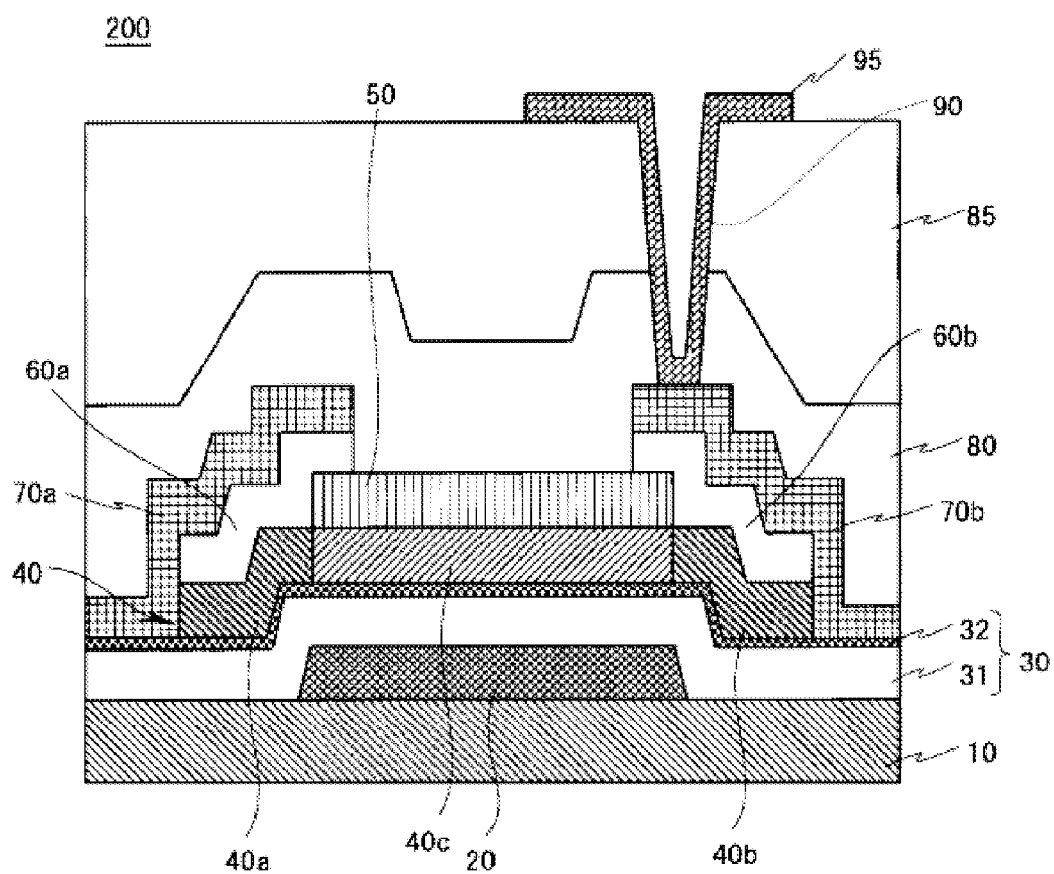
FIG. 10 is a cross-sectional view of the TFT that serves as a switching element in the pixel formation unit of the liquid crystal display device shown in FIG. 8.

FIG. 10 is a cross-sectional view of the TFT 200 that serves as a switching element of the pixel formation unit Pij of the liquid crystal display device 300. The TFT 200 shown in FIG. 10 is the same TFT as the TFT 100 shown in FIG. 4, except that the pixel electrode 95 is disposed thereabove, and therefore, the same reference characters are given to the same components as those in the TFT 100, and the descriptions thereof are omitted. As shown in FIG. 10, a planarizing film 85 is formed on a surface of the protective film 80, and a contact hole 90 that reaches a surface of the drain electrode 70b is formed in the planarizing film 85. On a surface of the planarizing film 85, the pixel electrode 95 made of a transparent metal such as ITO (Indium Tin Oxide) is formed, and the pixel electrode 95 is electrically connected to the drain electrode 70b through the contact hole 90. The gate electrode 20 is connected to one of the gate wiring lines G1 to Gn, and the source electrode 70a is connected to one of the source wiring lines S1 to Sm.

As described above, when the TFT 100 is used as a switching element in each pixel formation units Pij provided in the liquid crystal panel 310, the mobility of the channel layer 40 is increased, and therefore, in the TFT 100, it becomes possible to charge a signal voltage corresponding to the image signal sent from the source wiring line in the pixel capacitance in a short period of time. This allows for an increase in the number of the pixel formation unit Pij, thereby achieving the high resolution.

It is also possible to use the TFT 100 shown in FIG. 4 for the gate driver 330 and the source driver 340 formed in a frame portion of the liquid crystal panel 310. In this case, because the ON current of the TFT 100 is large, the operation speed of the gate driver 330 and the source driver 340 can be improved. As a result, the circuit size of the gate driver 330 and the source driver 340 can be reduced, which allows for a smaller frame area of the liquid crystal panel 310, and a lower power consumption of the liquid crystal display device 300.

4. Others

The TFT 100 according to the above-described embodiment was an n-channel TFT, but it may be a p-channel TFT. The channel layer 40 made of microcrystalline silicon was described above, but the channel layer 40 may be made of not only microcrystalline silicon, but also polycrystalline silicon. That is, microcrystalline silicon and polycrystalline silicon may be collectively referred to as crystalline silicon. In the description above, an example of using the TFT 100 for the liquid crystal display device 300 was explained, but the TFT 100 can also be used for an organic EL (Electro Luminescence) display device.

INDUSTRIAL APPLICABILITY

The present invention is applied to a bottom-gate thin film transistor, and more particularly, the present invention is suitably used for a switching element of an active matrix display device and a transistor constituting a driver circuit.

DESCRIPTION OF REFERENCE CHARACTERS 10 glass substrate (insulating substrate)
20 gate electrode
30 gate insulating film
31 silicon nitride film
32 natural oxide film
40 channel layer
50 etching stopper layer
100 TFT (thin film transistor)
200 TFT (switching element)
300 liquid crystal display device
310 liquid crystal panel (display unit)
330 gate driver
340 source driver

The invention claimed is:

1. A thin film transistor of a bottom-gate structure that is formed on an insulating substrate, comprising: a gate electrode formed on said insulating substrate; a gate insulating film formed so as to cover said insulating substrate including said gate electrode; and a channel layer that is made of a crystalline semiconductor film and that is formed on a surface of said gate insulating film, wherein said gate insulating film comprises: a nitride semiconductor film; and an oxide semiconductor film with a film thickness of 4 to 6 nm that is formed on a surface of said nitride semiconductor film; wherein said oxide semiconductor film is a natural oxide semiconductor film; wherein said crystalline semiconductor film is a microcrystalline semiconductor film, and wherein an oxygen concentration of said oxide semiconductor film is 12% or more and 24% or less.

2. An active matrix display device that displays an image, comprising:
a display unit that includes a plurality of gate wiring lines, a plurality of source wiring lines that intersect with said plurality of gate wiring lines, and pixel formation units arranged in a matrix corresponding to respective intersections of said plurality of gate wiring lines and said plurality of source wiring lines;
a gate driver that selectively activates said plurality of gate wiring lines; and
a source driver that applies an image signal representing an image that is to be displayed to said source wiring lines,
wherein each of said pixel formation units includes a switching element that is turned on and off based on a signal applied to a corresponding gate wiring line, and
wherein said switching element includes the thin film transistor according to claim 1.

3. An active matrix display device that displays an image, comprising:
a display unit that includes a plurality of gate wiring lines, a plurality of source wiring lines that intersect with said plurality of gate wiring lines, and pixel formation units arranged in a matrix corresponding to respective intersections of said plurality of gate wiring lines and said plurality of source wiring lines;
a gate driver that selectively activates said plurality of gate wiring lines; and
a source driver that applies an image signal representing an image that is to be displayed to said source wiring lines,
wherein said gate driver and said source driver include the thin film transistor according to claim 1.

4. A method for manufacturing a thin film transistor of a bottom-gate structure that is formed on an insulating substrate, comprising:
forming a gate electrode on said insulating substrate;
forming a gate insulating film so as to cover said insulating substrate including said gate electrode; and
forming a crystalline semiconductor film that becomes a channel layer on said gate insulating film by a plasma CVD method,
wherein forming said gate insulating film comprises:
forming a first nitride semiconductor film so as to cover said insulating substrate including said gate electrode; and
forming a natural oxide semiconductor film on a surface of said first nitride semiconductor film by exposing a surface of said first nitride semiconductor film to a gas containing oxygen of a prescribed concentration for a prescribed period of time.

5. The method for manufacturing a thin film transistor according to claim 4, further comprising, after forming said crystalline semiconductor film, forming a second nitride semiconductor film on a surface of said crystalline semiconductor film so as not to expose a surface of said crystalline semiconductor film to a gas containing oxygen.

6. The method for manufacturing a thin film transistor according to claim 5, further comprising forming an etching stopper layer on said crystalline semiconductor film in a position facing said gate electrode by etching said second nitride semiconductor film.

* * * * *